(12) United States Patent
Lewis et al.

(10) Patent No.: US 8,593,827 B1
(45) Date of Patent: Nov. 26, 2013

(54) COMPRESSIBLE ENGAGEMENT ASSEMBLY

(75) Inventors: Jeffrey Michael Lewis, Maynard, MA (US); Joseph P. King, Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 447 days.

(21) Appl. No.: 12/638,295

(22) Filed: Dec. 15, 2009

(51) Int. Cl.
*H05K 7/14* (2006.01)
*H05K 7/18* (2006.01)

(52) U.S. Cl.
USPC ............... 361/801; 403/322.1; 403/322.4

(58) Field of Classification Search
USPC ............ 403/321, 322.1, 322.3, 322.4, 325; 292/109, 110, 194, 195, 196, 198, 202, 292/210, 304, DIG. 30; 361/732, 747, 759, 361/801, 802; 439/152–160, 296–299, 327, 439/352; 211/26, 26.2, 41.12, 41.17, 41.18, 211/182, 192
See application file for complete search history.

(56) References Cited

U.S. PATENT DOCUMENTS

| | | | |
|---|---|---|---|
| 6,381,146 B1* | 4/2002 | Sevier | 361/754 |
| 6,508,495 B1* | 1/2003 | Riley | 292/152 |
| 6,567,274 B1* | 5/2003 | Tusan et al. | 361/740 |
| 6,878,006 B1* | 4/2005 | Heidenreich et al. | 439/352 |
| 6,912,124 B2* | 6/2005 | Megason et al. | 361/679.02 |
| 6,992,900 B1* | 1/2006 | Suzue et al. | 361/801 |
| 7,121,432 B2* | 10/2006 | Kostal et al. | 222/192 |
| 7,295,447 B2* | 11/2007 | Strmiska et al. | 361/798 |
| 7,301,778 B1* | 11/2007 | Fang | 361/759 |
| 7,338,098 B1* | 3/2008 | O'Kelley et al. | 292/304 |
| D578,127 S * | 10/2008 | Crisp et al. | D14/432 |
| 7,455,539 B2* | 11/2008 | Gunther et al. | 439/160 |
| 7,480,963 B2* | 1/2009 | Liang | 16/422 |
| 7,684,209 B2* | 3/2010 | Roesner | 361/798 |

* cited by examiner

*Primary Examiner* — Gregory Binda
*Assistant Examiner* — Nahid Amiri
(74) *Attorney, Agent, or Firm* — Brian J. Colandreo; Mark H. Whittenberger; Holland & Knight LLP

(57) ABSTRACT

A compressible engagement assembly includes a latching assembly configured to releasably engage a rack assembly. A compressible member is configured to be compressed by the latching assembly when the latching assembly is releasably engaged with the rack assembly. The compressible member is further configured to engage a rackmount component removably positioned within the rack assembly.

21 Claims, 8 Drawing Sheets

COMPRESSIBLE ENGAGEMENT ASSEMBLY

TECHNICAL FIELD

This disclosure relates to latching systems and, more particularly, to latching systems for use with electronic components.

BACKGROUND

Lever assemblies are often used to lock electronic components within rack assemblies. For example, power supply assemblies, storage assemblies, and/or processor assemblies may be locked within a rack assembly via a lever assembly. Such lever assemblies may assist the user with overcoming the mechanical requirements necessary to properly engage any electrical connectors located at the back of the electronic components.

Unfortunately, variations in component length and rack depth may complicate the use of such lever assemblies. For example, if a component is not long enough and/or the corresponding rack assembly is too deep, the electrical connectors at the back of the electronic component may not be fully engaged with the corresponding electrical connectors within the rack assembly, thus preventing proper communication between the electronic component and the rack assembly.

Conversely, if the electronic component is too long and/or the rack assembly is too shallow, the electrical connectors at the back of the electronic component may bottom out within the corresponding electrical connector within the rack assembly, thus preventing the proper engagement of the lever assembly.

SUMMARY OF DISCLOSURE

In one embodiment, a compressible engagement assembly includes a latching assembly configured to releasably engage a rack assembly. A compressible member is configured to be compressed by the latching assembly when the latching assembly is releasably engaged with the rack assembly. The compressible member is further configured to engage a rackmount component removably positioned within the rack assembly.

One or more of the following features may be included. The rackmount component may be chosen from the group consisting of a power supply assembly, a storage assembly, a network assembly, and a processor assembly. The rackmount component may include a first portion of the an electrical connector and the rack assembly may include a second portion of the electrical connector, wherein the first and second portions of the electrical connector may be configured to be releasably electrically coupled when the latching assembly is releasably engaged with the rack assembly.

The first and second portions of the electrical connector may be configured to be fully engaged when the latching assembly is releasably engaged with the rack assembly. The rack assembly may have a defined maximum component depth and the rackmount component may be configured to be longer than the maximum component depth by a desired compression amount. The compressible member may be configured to be compressed by the desired compression amount when the latching assembly is releasably engaged with the rack assembly.

The desired compression amount may be less than a maximum compression amount of the compressible member. The compressible member may be a flat spring assembly. A slidable assembly may be configured to slidably couple the latching assembly and the rackmount component.

In one embodiment, a rackmount component includes a rackmount component chassis configured to be removably positioned within the rack assembly. A latching assembly is coupled to the rackmount component chassis and configured to releasably engage the rack assembly. A compressible member is configured to engage the rackmount component chassis and to be compressed by the latching assembly when the latching assembly is releasably engaged with the rack assembly.

One or more of the following features may be included. The rackmount component may be chosen from the group consisting of a power supply assembly, a storage assembly, a network assembly, and a processor assembly. The rackmount component may include a first portion of the an electrical connector and the rack assembly may include a second portion of the electrical connector. The first and second portions of the electrical connector may be configured to be releasably electrically coupled when the latching assembly is releasably engaged with the rack assembly. The first and second portions of the electrical connector may be configured to be fully engaged when the latching assembly is releasably engaged with the rack assembly.

The rack assembly may have a defined maximum component depth and the rackmount component may be configured to be longer than the maximum component depth by a desired compression amount. The compressible member may be configured to be compressed by the desired compression amount when the latching assembly is releasably engaged with the rack assembly. The desired compression amount may be less than a maximum compression amount of the compressible member. The compressible member may be a flat spring assembly. A slidable assembly may be configured to slidably couple the latching assembly and the rackmount component chassis.

In one embodiment, a compressible engagement assembly includes a latching assembly configured to releasably engage a rack assembly. A compressible member is configured to be compressed by the latching assembly when the latching assembly is releasably engaged with the rack assembly. The compressible member is further configured to engage a rackmount component removably positioned within the rack assembly. The rackmount component includes a first portion of the an electrical connector and the rack assembly includes a second portion of the electrical connector. The first and second portions of the electrical connector are configured to be releasably electrically coupled when the latching assembly is releasably engaged with the rack assembly. The rack assembly has a defined maximum component depth and the rackmount component is configured to be longer than the maximum component depth by a desired compression amount. The compressible member is configured to be compressed by the desired compression amount when the latching assembly is releasably engaged with the rack assembly.

One or more of the following features may be included. The rackmount component may be chosen from the group consisting of a power supply assembly, a storage assembly, a network assembly, and a processor assembly. The desired compression amount may be less than a maximum compression amount of the compressible member. The compressible member may be a flat spring assembly. A slidable assembly may be configured to slidably couple the latching assembly and the rackmount component.

The details of one or more implementations are set forth in the accompanying drawings and the description below. Other

BRIEF DESCRIPTION OF THE DRAWINGS

Like reference symbols in the various drawings indicate like elements.

DETAILED DESCRIPTION OF THE PREFERRED EMBODIMENTS

Figure 1:
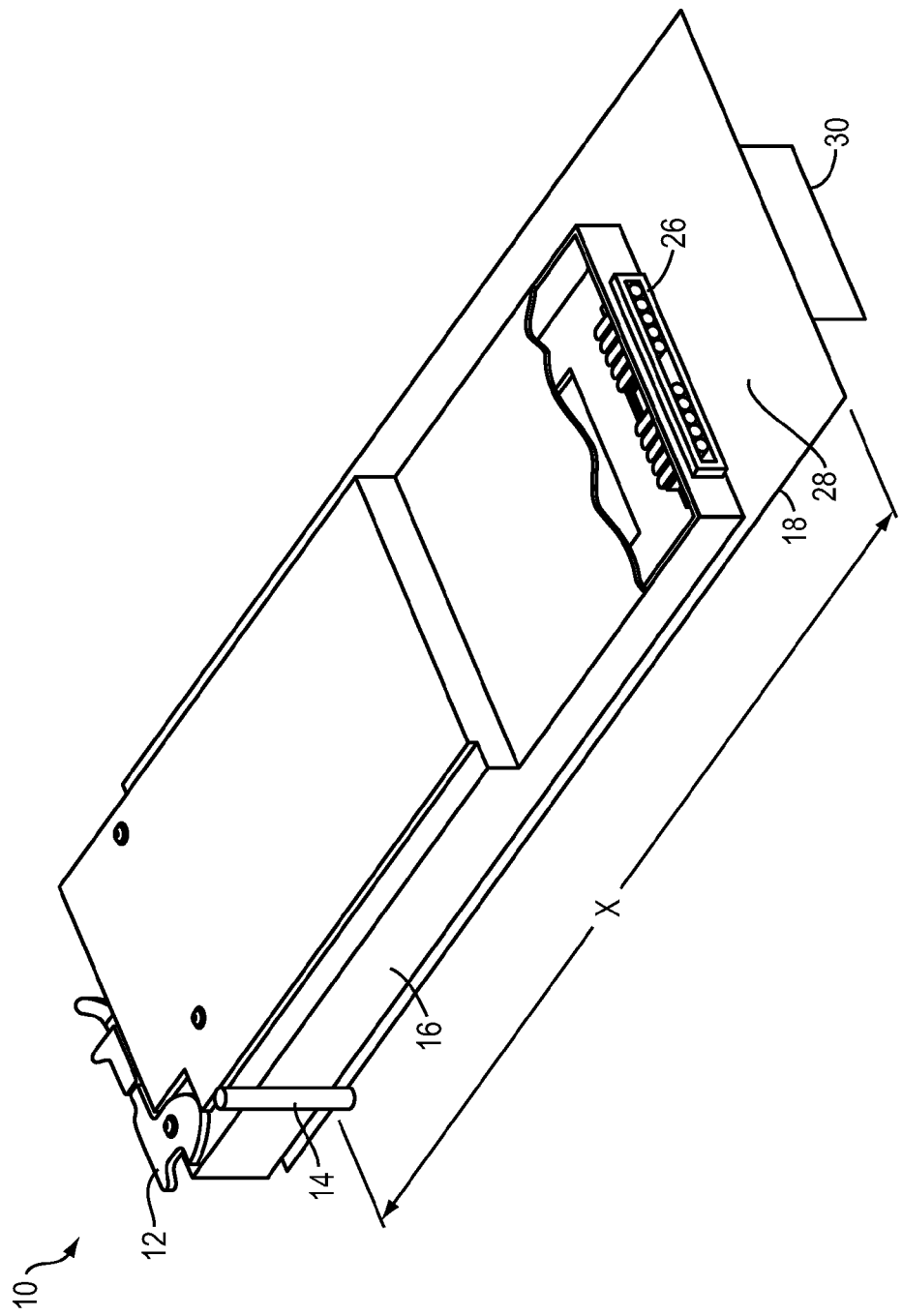
FIG. 1 is an isometric view of a compressible engagement assembly included within a rackmount component.
Figure 2:
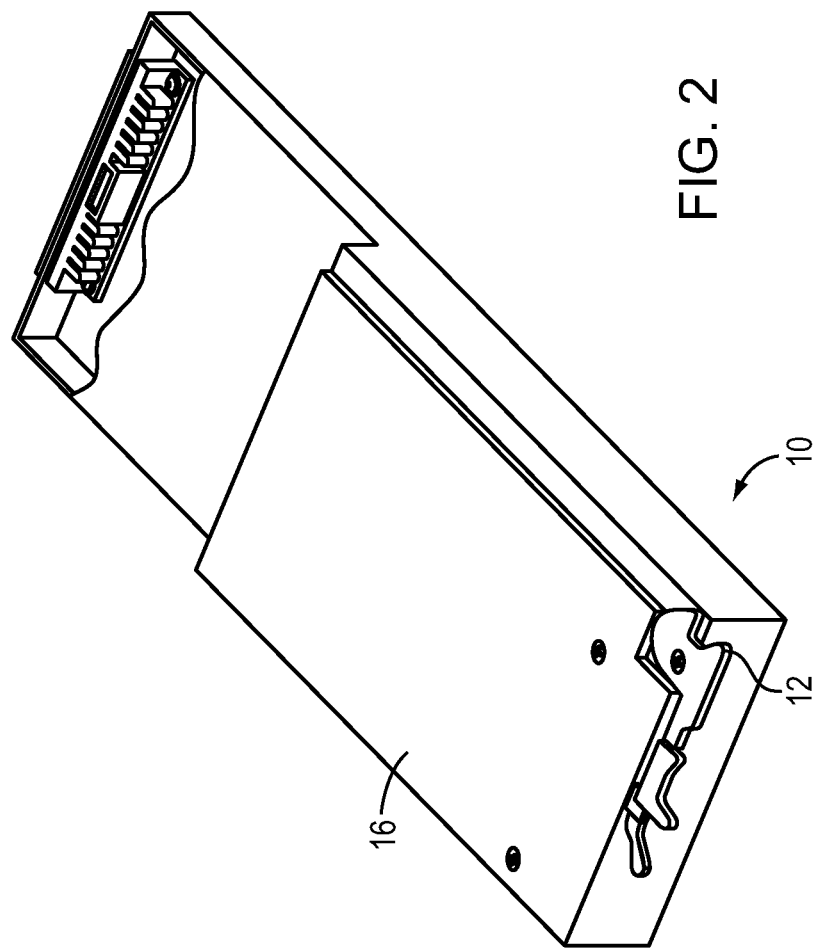
FIG. 2 is another isometric view of the compressible engagement assembly of FIG. 1.
Figure 3:
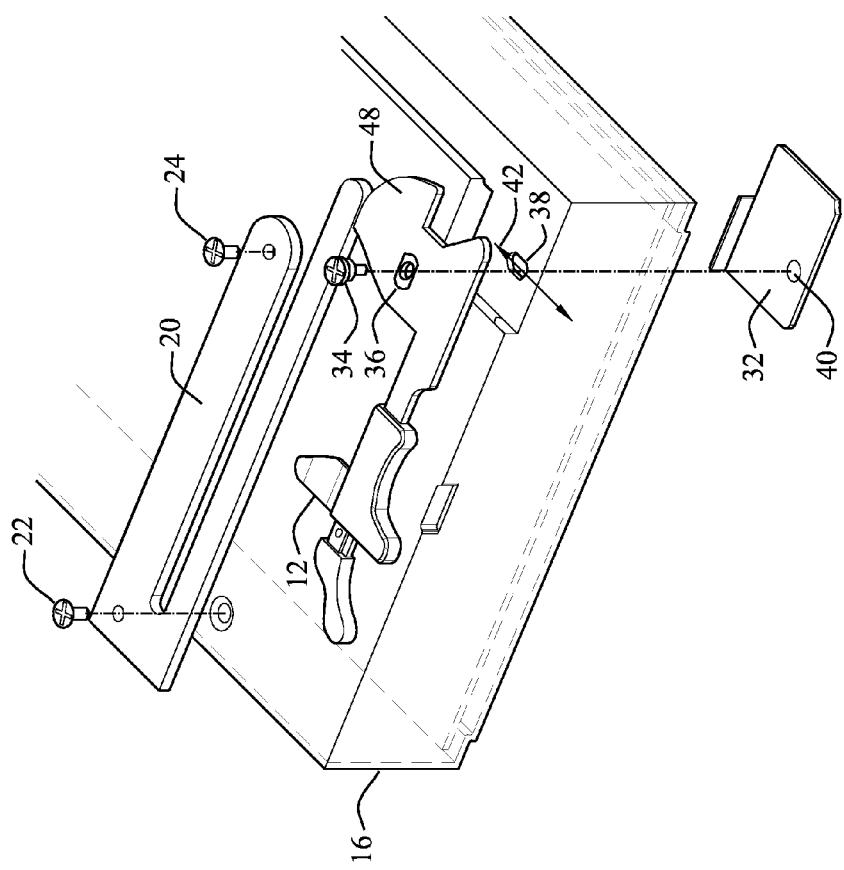
FIG. 3 is another isometric view of the compressible engagement assembly of FIG. 1.
Figure 4:
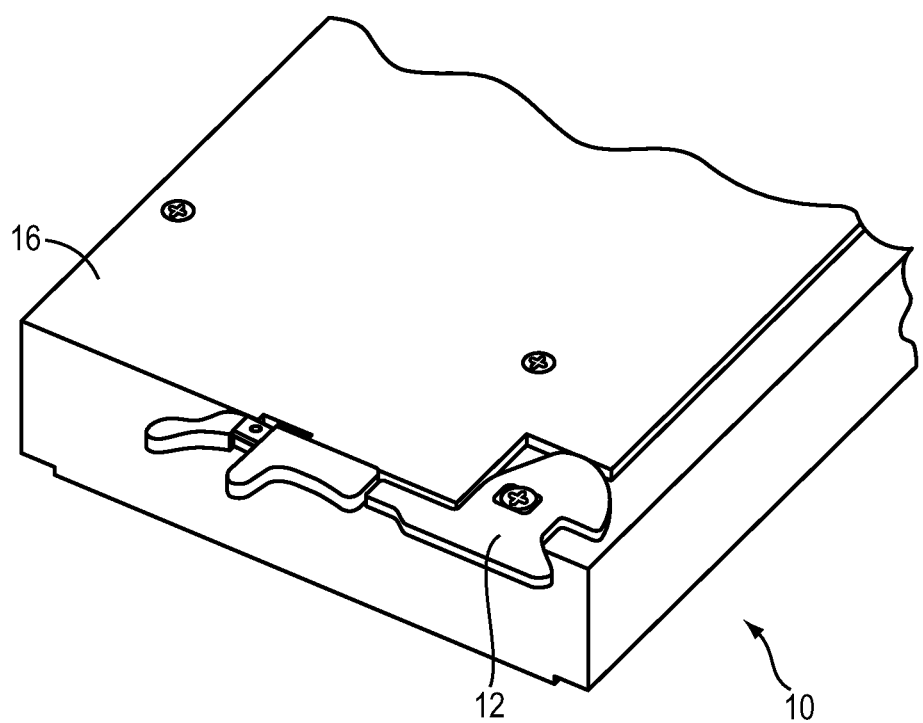
FIG. 4 is another isometric view of the compressible engagement assembly of FIG. 1.

Referring to FIGS. 1-4, there is shown compressible engagement assembly 10 that may include latching assembly 12 configured to releasably engage rack assembly 14. Examples of rack assembly 14 may include racks used within data centers to hold various pieces of computing equipment (e.g., rackmount component 16). Rack assembly 14 may include a plurality of slots (e.g., slot 18) into which rackmount component 16 may be positioned. Examples of rackmount component 16 may include but are not limited to a power supply assembly (e.g., which provides power to various other rackmount components; not shown), a storage assembly (e.g., a hard drive array; not shown), a network assembly (e.g., a router; not shown), and a processor assembly (e.g., a processor module; not shown).

Compressible member 20 (e.g., a flat spring assembly) may be configured to be compressed by latching assembly 12 when latching assembly 12 is releasably engaged with rack assembly 14. Compressible member 20 may be further configured to engage rackmount component 16, which (as described above) may be removably positioned within slot assembly 18 of rack assembly 14. For example, one or more fasteners (e.g., screws 22, 24) to rigidly affix compressible member 20 to rackmount component 16.

Rackmount component 16 may include first portion 26 of electrical connector 28 and rack assembly 14 may include second portion 30 of electrical connector 28. First and second portions 26, 30 of electrical connector 28 may be configured to be releasably electrically coupled when latching assembly 12 is releasably engaged with rack assembly 14. Slidable assembly 32 may be configured to slidably couple latching assembly 12 and rackmount component 16. For example, latching assembly 12 may be pivotally coupled to slidable assembly 32 via fastener assembly 34 (e.g., a screw assembly). Fastener assembly 34 may pass through washer assembly 36 positioned on top of latching assembly 12. Fastener assembly 34 may be configured to pass though slotted hole 38 included within rackmount component 16. Slidable assembly 34 may include threaded hole 40 into which fastener assembly 34 may be threaded. Fastener assembly 34 may be a shouldered fastener assembly configured to allow fastener assembly 34 to be tightened within threaded hole 40 while still allowing for movement of slidable assembly 34 along longitudinal axis 42 of slotted hole 38.

The first and second portions 26, 30 of electrical connector 28 may be configured to be fully engaged when latching assembly 12 is releasably engaged with rack assembly 14. Rack assembly 14 may have a defined maximum component depth (X) and rackmount component 16 may be configured to be longer than the maximum component depth (X) by a desired compression amount ($\Delta X$). A typical example of $\Delta X$ is 0.060 inches. Compressible member 20 may be configured to be compressed by the desired compression amount ($\Delta X$) when latching assembly 12 is releasably engaged with rack assembly 14. This desired compression amount ($\Delta X$) may be less than a maximum compression amount of compressible member 20. For example, compressible member 20 may be configured to have a maximum compression amount of 0.120 inches.

Figure 5:
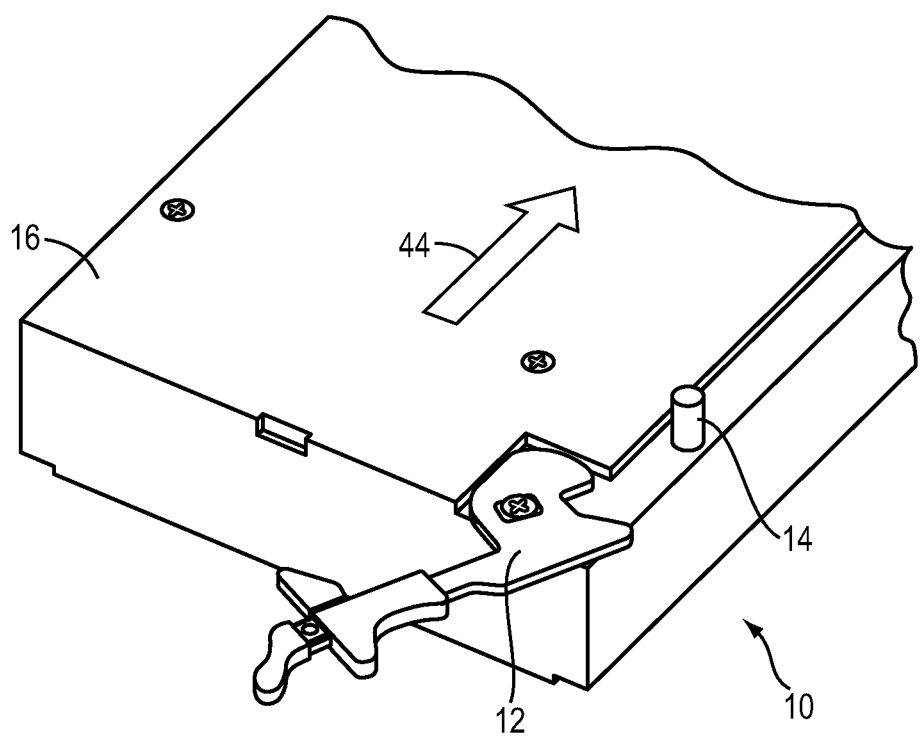
FIG. 5 is another isometric view of the compressible engagement assembly of FIG. 1.
Figure 6:
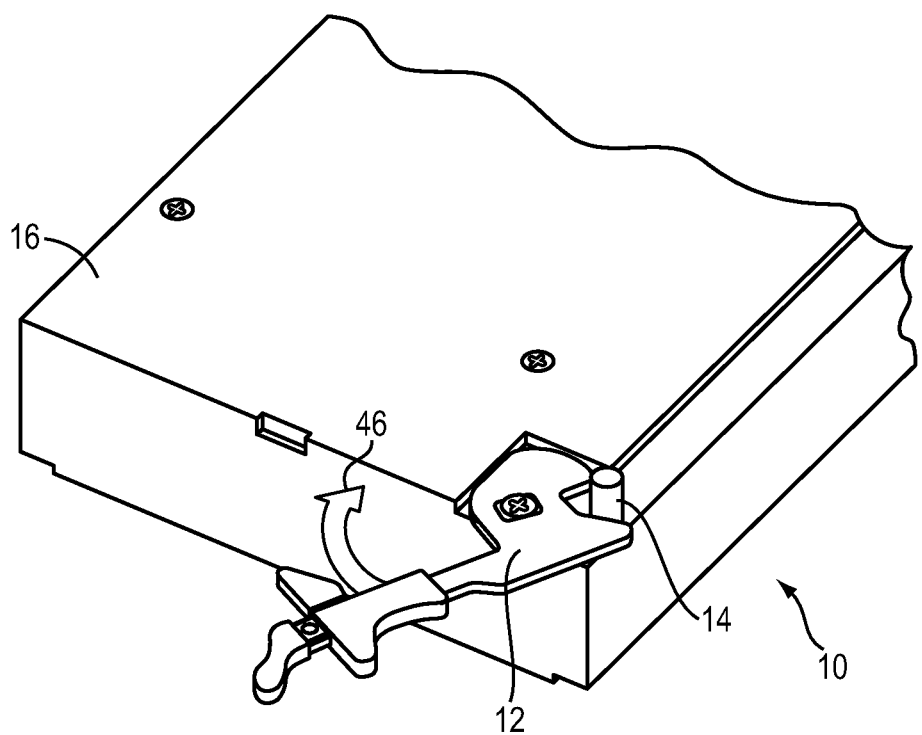
FIG. 6 is another isometric view of the compressible engagement assembly of FIG. 1.
Figure 7:
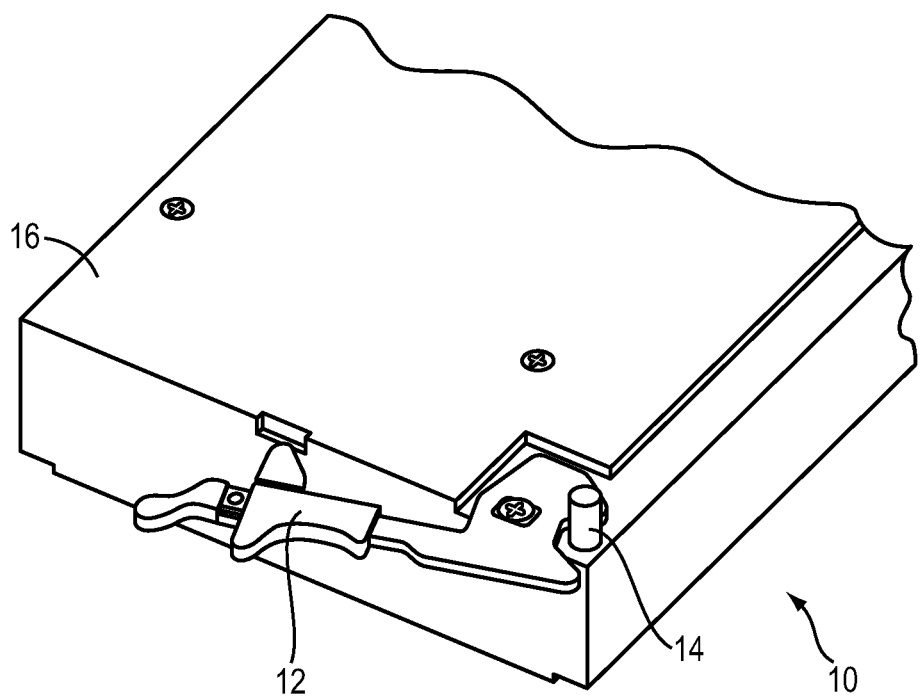
FIG. 7 is another isometric view of the compressible engagement assembly of FIG. 1.
Figure 8:
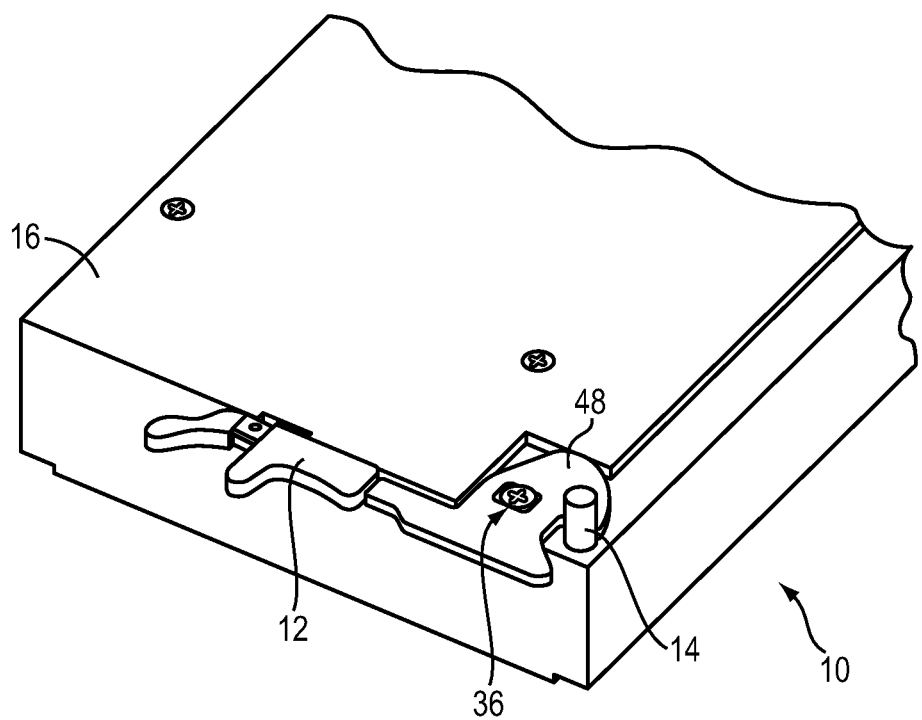
FIG. 8 is another isometric view of the compressible engagement assembly of FIG. 1.

Referring to FIGS. 5-8, during insertion of rackmount component 16, rackmount component 16 may be inserted into rack assembly 14 by pushing rackmount component 16 into slot 18 of rack assembly 14 in the directions of arrow 44. Once fully inserted, the retaining pin of rack assembly 14 may be positioned within a notch of latching assembly 12. Latching assembly 12 may then be rotated (in the direction of arrow 46) forcing camming surface 48 against compressible member 20, resulting in first and second portions 26, 30 of electrical connector 28 being fully engaged when latching assembly 12 is fully latched. Compressible member 20 may be configured so that the minimum compressive resistance of compressible member 20 is at least equal to the force required to releasably electrically couple first and second portions 26, 30 of electrical connector 28 (i.e., to be fully engaged when latching assembly 12 is releasably engaged with rack assembly 14).

While compressible member 20 is shown to be a flat spring assembly, this is for illustrative purpose only and is not intended to be a limitation of this disclose, as other configures are possible. For example, one or more "coil spring" compressible members may be utilized.

A number of implementations have been described. Nevertheless, it will be understood that various modifications may be made. Accordingly, other implementations are within the scope of the following claims.

What is claimed is:

1. A compressible engagement assembly comprising:
   a rack assembly including at least one slot to receive a rackmount component;
   a latching assembly releasably engaged with the rack assembly;
   a compressible member to be compressed by the latching assembly when the latching assembly is releasably engaged with the rack assembly, the compressible member further engaged with the rackmount component removably positioned within the at least one slot of the rack assembly; and
   a slidable assembly pivotally coupled to the latching assembly near a camming surface of the latching assembly, wherein the latching assembly is configured to rotate in an unlatched position to force the camming surface of the latching assembly against the compressible member, wherein the slidable assembly includes a threaded hole and a fastener assembly tightened within the threaded hole allowing for movement of the slidable assembly.

2. The compressible engagement assembly of claim 1 wherein the rackmount component is one of a power supply assembly, a storage assembly, a network assembly, and a processor assembly.

3. The compressible engagement assembly of claim 1 wherein the rackmount component includes a first portion of an electrical connector and the rack assembly includes a second portion of the electrical connector, wherein the first and second portions of the electrical connector are located on an opposite end of the compressible engagement assembly from the latching assembly and to be releasably electrically coupled when the latching assembly is releasably engaged with the rack assembly.

4. The compressible engagement assembly of claim 3 wherein the first and second portions of the electrical connector are configured to be fully engaged when the latching assembly is releasably engaged with the rack assembly.

5. The compressible engagement assembly of claim 1 wherein the rack assembly has a defined maximum component depth and the rackmount component is configured to be longer than the maximum component depth by a desired compression amount, wherein the compressible member is configured to be compressed by the desired compression amount when the latching assembly is releasably engaged with the rack assembly.

6. The compressible engagement assembly of claim 5 wherein the desired compression amount is less than a maximum compression amount of the compressible member.

7. The compressible engagement assembly of claim 1 wherein the compressible member is a flat spring assembly.

8. The compressible engagement assembly of claim 1 wherein the slidable assembly slidably couples the latching assembly and the rackmount component.

9. A compressible engagement assembly comprising:
a rack assembly including at least one slot to receive a rackmount component;
the rackmount component removably positioned within the at least one slot of the rack assembly;
a latching assembly coupled to the rackmount component and releasably engaged with the rack assembly;
a compressible member engaged with the rackmount component and to be compressed by the latching assembly when the latching assembly is releasably engaged with the rack assembly; and
a slidable assembly pivotally coupled to the latching assembly near a camming surface of the latching assembly, wherein the latching assembly is configured to rotate in an unlatched position to force the camming surface of the latching assembly against the compressible member, wherein the slidable assembly includes a threaded hole and a fastener assembly tightened within the threaded hole allowing for movement of the slidable assembly.

10. The compressible engagement assembly of claim 9 wherein the rackmount component is one of a power supply assembly, a storage assembly, a network assembly, and a processor assembly.

11. The compressible engagement assembly of claim 9 wherein the rackmount component is a first portion of an electrical connector and the rack assembly includes a second portion of the electrical connector, wherein the first and second portions of the electrical connector are located on an opposite end of the compressible engagement assembly from the latching assembly and to be releasably electrically coupled when the latching assembly is releasably engaged with the rack assembly.

12. The compressible engagement assembly of claim 11 wherein the first and second portions of the electrical connector are configured to be fully engaged when the latching assembly is releasably engaged with the rack assembly.

13. The compressible engagement assembly of claim 9 wherein the rack assembly has a defined maximum component depth and the rackmount component is configured to be longer than the maximum component depth by a desired compression amount, wherein the compressible member is configured to be compressed by the desired compression amount when the latching assembly is releasably engaged with the rack assembly.

14. The compressible engagement assembly of claim 13 wherein the desired compression amount is less than a maximum compression amount of the compressible member.

15. The compressible engagement assembly of claim 9 wherein the compressible member is a flat spring assembly.

16. The compressible engagement assembly of claim 9 wherein the slidable assembly slidably couples the latching assembly and the rackmount component chassis.

17. A compressible engagement assembly comprising:
a rack assembly including at least one slot to receive a rackmount component;
a latching assembly releasably engaged with the rack assembly;
a compressible member to be compressed by the latching assembly when the latching assembly is releasably engaged with the rack assembly, the compressible member further engaged with the rackmount component removably positioned within the at least one slot of the rack assembly; and
a slidable assembly pivotally coupled to the latching assembly near a camming surface of the latching assembly, wherein the latching assembly is configured to rotate in an unlatched position to force the camming surface of the latching assembly against the compressible member, wherein the slidable assembly includes a threaded hole and a fastener assembly tightened within the threaded hole allowing for movement of the slidable assembly;
wherein the rackmount component includes a first portion of an electrical connector and the rack assembly includes a second portion of the electrical connector, wherein the first and second portions of the electrical connector are configured to be releasably electrically coupled when the latching assembly is releasably engaged with the rack assembly;
wherein the rack assembly has a defined maximum component depth and the rackmount component is configured to be longer than the maximum component depth by a desired compression amount, wherein the compressible member is configured to be compressed by the desired compression amount when the latching assembly is releasably engaged with the rack assembly.

18. The compressible engagement assembly of claim 17 wherein the rackmount component is one of a power supply assembly, a storage assembly, a network assembly, and a processor assembly.

19. The compressible engagement assembly of claim 17 wherein the desired compression amount is less than a maximum compression amount of the compressible member.

20. The compressible engagement assembly of claim 17 wherein the compressible member is a flat spring assembly.

21. The compressible engagement assembly of claim 17 wherein the slidable assembly slidably couples the latching assembly and the rackmount component.

* * * * *